(12) United States Patent
Ding et al.

(10) Patent No.: US 9,905,587 B2
(45) Date of Patent: Feb. 27, 2018

(54) ARRAY SUBSTRATE COMPRISING A CONDUCTIVE CONTACT FORMED ON A SURFACE OF A PIXEL ELECTRODE EXPOSED BY AN OPENING, MANUFACTURING METHOD THEREOF, AND DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jinbo Ding, Beijing (CN); Bin Li, Beijing (CN); Jian Li, Beijing (CN); Jian Ren, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 238 days.

(21) Appl. No.: 14/500,178

(22) Filed: Sep. 29, 2014

(65) Prior Publication Data

US 2015/0253635 A1    Sep. 10, 2015

(30) Foreign Application Priority Data

Mar. 7, 2014 (CN) .......................... 2014 1 0083490

(51) Int. Cl.
*H01L 27/12* (2006.01)
*G02F 1/1343* (2006.01)
(Continued)

(52) U.S. Cl.
CPC ........ *H01L 27/1259* (2013.01); *G02F 1/1368* (2013.01); *G02F 1/134309* (2013.01);
(Continued)

(58) Field of Classification Search
CPC ................. H01L 27/1259; G02F 2001/134372
See application file for complete search history.

(56) References Cited

U.S. PATENT DOCUMENTS

2001/0019375 A1* 9/2001 Kwon ............... G02F 1/136227
349/43
2004/0263706 A1* 12/2004 Cho .................. G02F 1/136286
349/43
(Continued)

FOREIGN PATENT DOCUMENTS

CN          101079429 A     11/2007
CN          101097925 A      1/2008
(Continued)

OTHER PUBLICATIONS

1st office action issued in Chinese application No. 201410083490.6 dated Dec. 17, 2015.

*Primary Examiner* — Paul Lee
(74) *Attorney, Agent, or Firm* — Nath, Goldberg & Meyer; Joshua B. Goldberg; Annie J. Kock

(57) ABSTRACT

The present invention provides an array substrate and a manufacturing method thereof, and a display panel comprising said array substrate. The array substrate comprises a plurality of pixel units, each of which comprising: a gate formed on a substrate; a gate insulating layer formed on the gate; an active layer being corresponding to the gate and formed on the gate insulating layer; a source and a drain formed on the active layer respectively; a pixel electrode formed on the gate insulating layer and electrically connected to the drain; a passivation layer covering the source, the drain and the pixel electrode; and a common electrode being corresponding to the pixel electrode and formed on the passivation layer, wherein an opening passing through the
(Continued)

passivation layer is formed in the common electrode, so as to expose the pixel electrode below the passivation layer.

10 Claims, 4 Drawing Sheets

(51) Int. Cl.
*G02F 1/1368* (2006.01)
*H01L 29/417* (2006.01)
*H01L 29/45* (2006.01)

(52) U.S. Cl.
CPC ...... *H01L 27/124* (2013.01); *H01L 29/41733* (2013.01); *H01L 29/45* (2013.01); *H01L 29/458* (2013.01); *G02F 2001/134372* (2013.01)

(56) References Cited

U.S. PATENT DOCUMENTS

| | | | |
|---|---|---|---|
| 2009/0059110 A1* | 3/2009 | Sasaki | G02F 1/134363 349/39 |
| 2012/0069257 A1* | 3/2012 | Oh | G02F 1/13338 349/42 |
| 2012/0132918 A1* | 5/2012 | Mizoguchi | H01L 27/124 257/59 |
| 2012/0162050 A1* | 6/2012 | Zhan | G06F 1/00 345/55 |

FOREIGN PATENT DOCUMENTS

| | | |
|---|---|---|
| CN | 103413810 A | 11/2013 |
| JP | 2004062145 A | 2/2004 |
| KR | 20000039794 A | 7/2000 |

* cited by examiner

ARRAY SUBSTRATE COMPRISING A CONDUCTIVE CONTACT FORMED ON A SURFACE OF A PIXEL ELECTRODE EXPOSED BY AN OPENING, MANUFACTURING METHOD THEREOF, AND DISPLAY PANEL

FIELD OF THE INVENTION

The present invention relates to the field of display technology, and in particular relates to an array substrate and a manufacturing method thereof, and a display panel.

BACKGROUND OF THE INVENTION

Due to the advantages of light weight, thin thickness, small size, low power consumption, low heat, etc., an LCD (Liquid Crystal Display) stands out from numerous different types of displays and has been widely applied to TVs, computers, tablet computers, mobile phones and other modern information appliances.

For thin-film transistor liquid crystal display panels, the characteristics of the thin-film transistors have significant influence on the display quality of the display panels, and many poor display events are all related to the abnormity of characteristics of the thin-film transistors. For TN (Twirsted Enmatic) display panels, the switching characteristics of each thin-film transistor can be tested easily. However, for the conventional ADS (Advanced Super Dimension Switch) array substrates as shown in FIGS. 1A-1C, the switching characteristics of a thin-film transistor cannot be tested directly. As shown in FIGS. 1A-1C, a conventional ADS array substrate comprises a substrate 1; a gate 2 formed on the substrate 1; a gate insulating layer 7 formed on the gate 2; an active layer 4 being corresponding to the gate 2 and formed on the gate insulating layer 7; a source-drain electrode 3 formed on the active layer 4; a pixel electrode 5 formed on the gate insulating layer 7 and electrically connected to the drain of the thin-film transistor; a passivation layer 8 covering the source-drain electrode 3 and the pixel electrode 5; and a common electrode 6 being corresponding to the pixel electrode 5 and formed on the passivation layer 8. In the ADS array substrate, the pixel electrode 5 is located beneath the common electrode 6 and the passivation layer 8 (as shown in FIG. 1B and FIG. 1C), thus the switching characteristics of the thin-film transistor cannot be measured directly. As a result, it is unable to determine the impact of the characteristics of the thin-film transistor on the poor display events during failure analysis, greatly influencing the analysis for the poor display events of the display panel.

SUMMARY OF THE INVENTION

The technical problem to be solved by the present invention is that it is difficult to measure the switching characteristics of the thin-film transistor in the ADS array substrate.

To solve the technical problem mentioned above, the present invention provides an array substrate, comprising a plurality of pixel units, each of which comprising: a gate formed on a substrate; a gate insulating layer formed on the gate; an active layer being corresponding to the gate and formed on the gate insulating layer; a source and a drain respectively formed on the active layer; a pixel electrode formed on the gate insulating layer and electrically connected to the drain; a passivation layer covering the source, the drain and the pixel electrode; and a common electrode being corresponding to the pixel electrode and formed on the passivation layer, wherein an opening passing through the passivation layer is formed in the common electrode, so as to expose the pixel electrode below the passivation layer.

Preferably, the array substrate further comprises a conductive contact formed on a part of the pixel electrode exposed by the opening.

Further, the drain is formed on the pixel electrode.

The present invention further provides a display panel, comprising any one array substrate described above, wherein a black matrix inside the display panel shield the openings.

Further, the openings are formed in blue pixels of the display panel.

Further, the display panel comprises at least nine openings which are distributed uniformly.

The present invention further provides a manufacturing method of an array substrate, comprising the following steps: forming a gate on a substrate; forming a gate insulating layer on the gate; forming an active layer corresponding to the gate on the gate insulating layer; forming a pixel electrode on the gate insulating layer; forming a source and a drain on the active layer; depositing a passivation layer to cover the source, the drain and the pixel electrode; forming a common electrode corresponding to the pixel electrode on the passivation layer; and forming an opening passing through the passivation layer in the common electrode, so as to expose the pixel electrode below the passivation layer.

The method further comprises: forming a conductive contact on a part of the pixel electrode exposed by the opening.

Further, the conductive contact is formed in the same step as the source and the drain.

Further, the drain is formed on the pixel electrode.

With the solutions disclosed by the present invention, by using the existing manufacturing process with mask, an array substrate in which the characteristics of the thin-film transistor can be measured easily is manufactured, so that the accuracy of analysis for poor display events of the display panel is improved.

BRIEF DESCRIPTION OF THE DRAWINGS

The features and advantages of the present invention will be understood more clearly with reference to the accompanying drawings. The drawings are illustrative and should not be regarded as any limitation to the present invention. In the drawings.

DETAILED DESCRIPTION OF THE EMBODIMENTS

The embodiments of the present invention will be described in details as below in conjunction with the accompanying drawings.

Figure 1A:
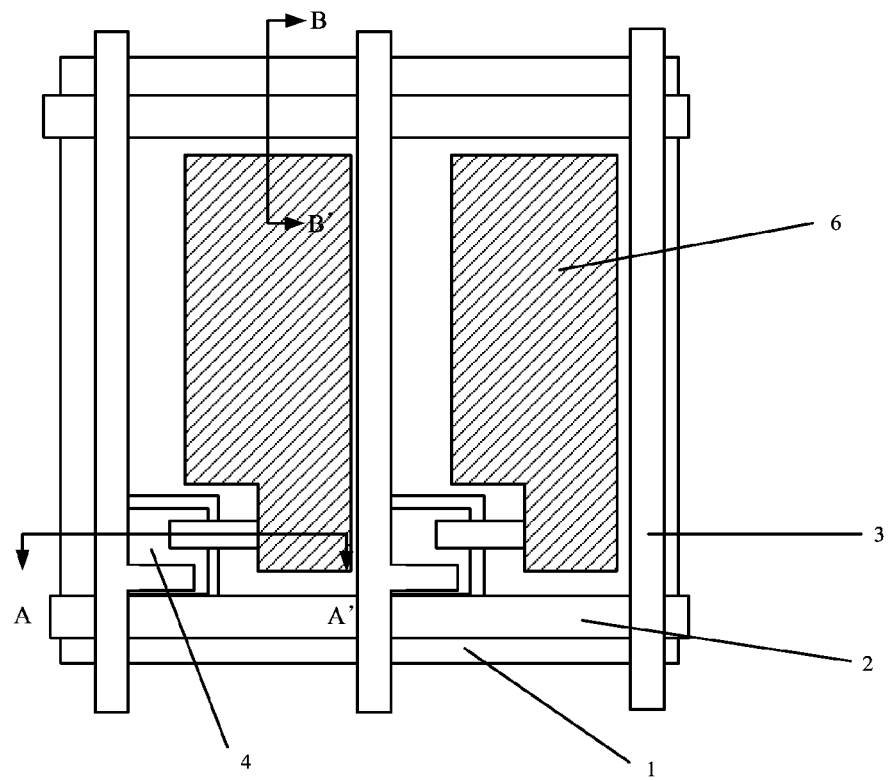
FIG. 1A is a plan view of an ADS array substrate in the prior art.
Figure 1B:
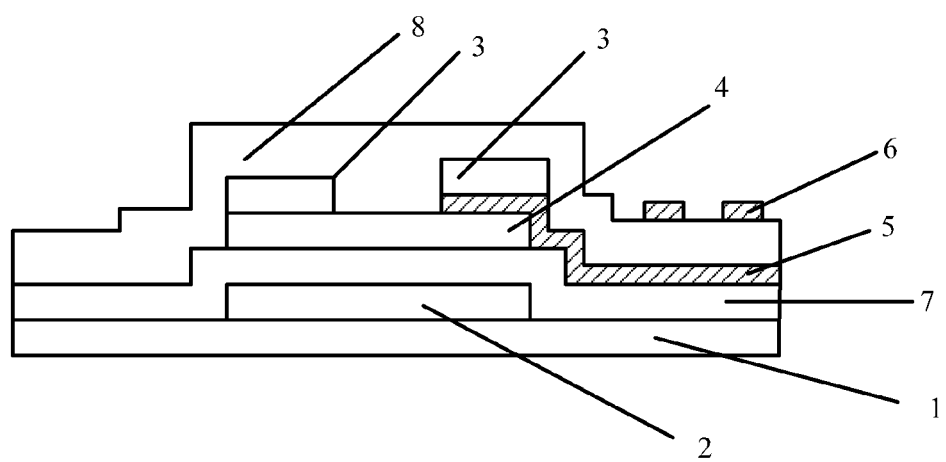
FIG. 1B is a sectional view taken along line A-A' in FIG. 1A.
Figure 1C:
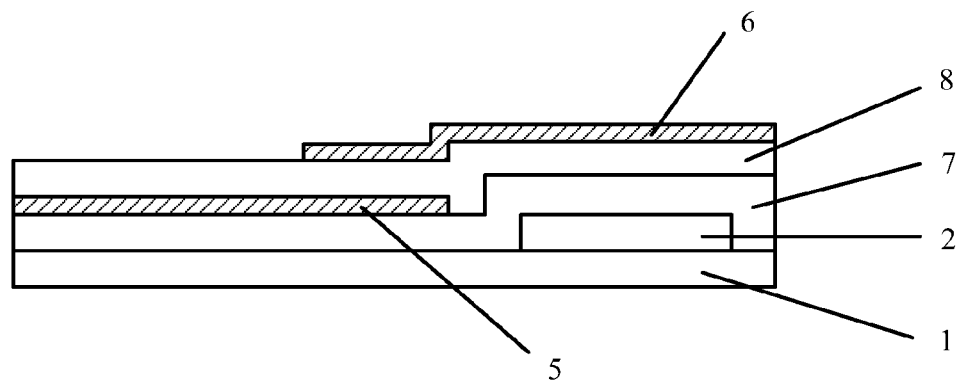
FIG. 1C is a sectional view taken along line B-B' in FIG. 1A.
Figure 2A:
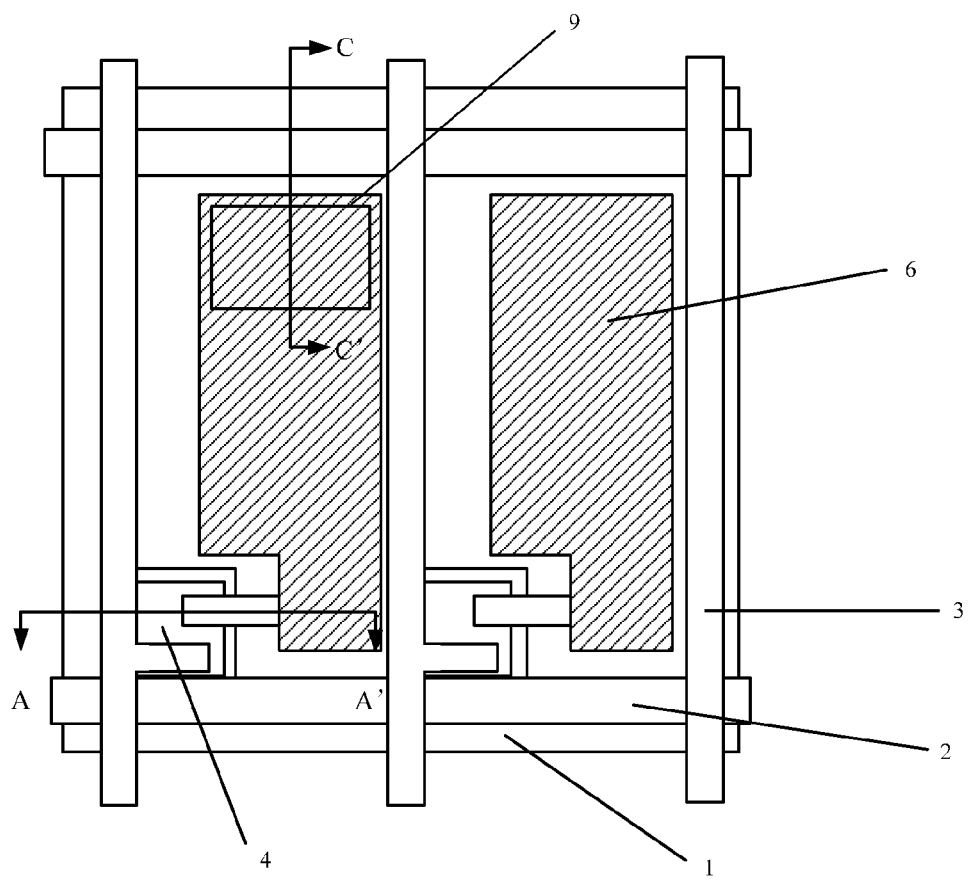
FIG. 2A is a plan view of an array substrate according to an embodiment of the present invention.
Figure 2B:
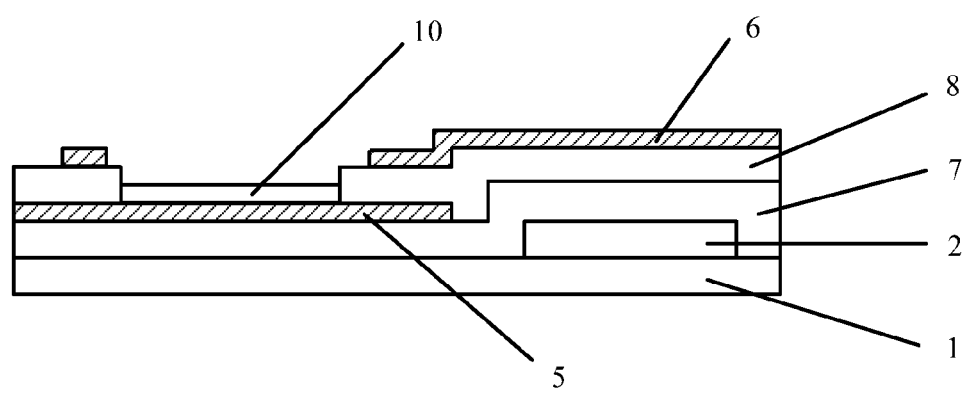
FIG. 2B is a sectional view taken along line C-C' in FIG. 2A.

FIG. 2A is a plan view of an array substrate according to an embodiment of the present invention, and FIG. 2B is a sectional view taken along line C-C' in FIG. 2A. As the sectional view taken along line A-A' in FIG. 2A is the same as FIG. 1B, the sectional view taken along line A-A' in FIG. 2A will not be shown repeatedly here. As shown in FIG. 1B, similar to the array substrate in the prior art, the array substrate according to an embodiment of the present invention comprises a plurality of pixel units, each of which comprises: a substrate 1; a gate 2 formed on the substrate 1; a gate insulating layer 7 formed on the gate 2; an active layer 4 being corresponding to the gate 2 and formed on the gate insulating layer 7; a source-drain electrode 3 formed on the active layer 4; a pixel electrode 5 formed on the gate insulating layer 7 and electrically connected to the drain of the thin-film transistor; a passivation layer 8 covering the source-drain electrode 3 and the pixel electrode 5; and a common electrode 6 being corresponding to the pixel electrode 5 and formed on the passivation layer 8. Different from the array substrate in the prior art, the array substrate according to an embodiment of the present invention further comprises an opening (as shown in FIG. 2A) formed in the common electrode 6, the opening 9 passing through the passivation layer 8 to expose the pixel electrode 5 below the passivation layer 8, and a conductive contact 10 is formed on the exposed part of the pixel electrode 5 for testing the thin-film transistor, as shown in FIG. 2B. The conductive contact 10 may be made of the same material as the source and the drain. Therefore, the conductive contact 10 may be formed in the same step as the source-drain electrode 3.

Figure 3:
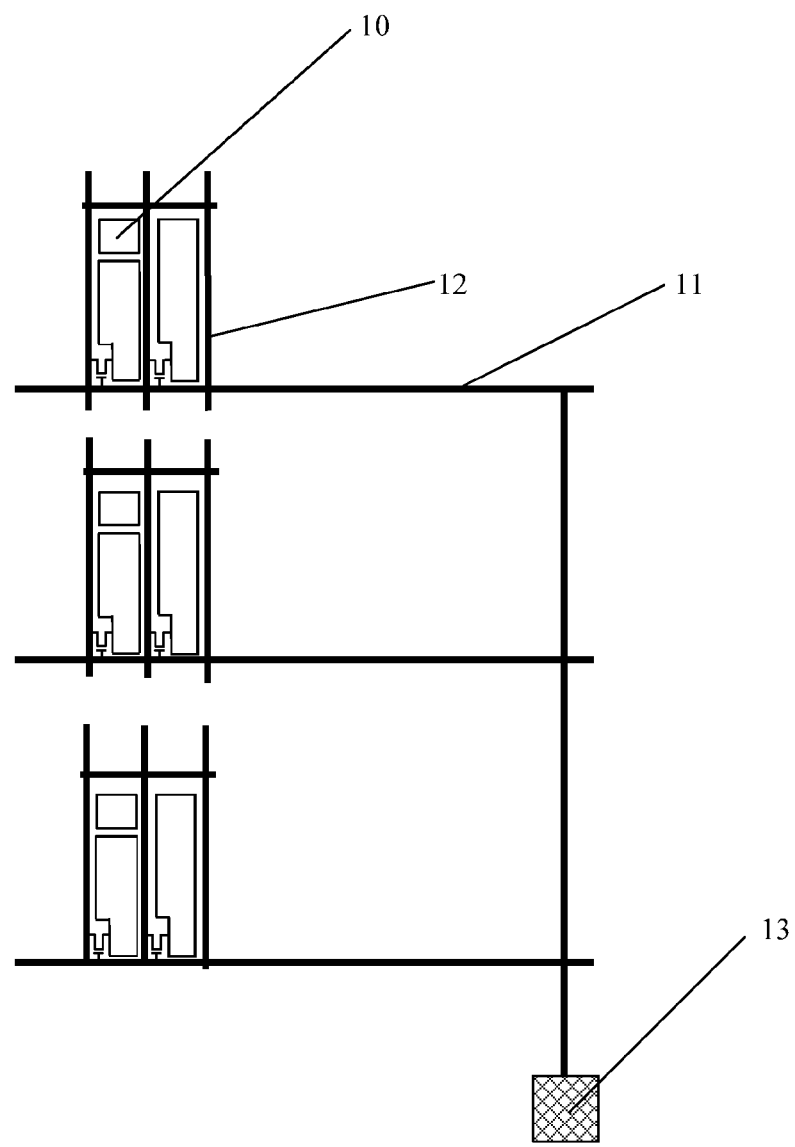
FIG. 3 is a test diagram of an array substrate according to an embodiment of the present invention.

During the test of the characteristics of the thin-film transistor, a gate signal and a source signal need to be loaded; furthermore, a drain signal needs to be measured. FIG. 3 is a test diagram of an array substrate according to the embodiment of the present invention. As shown in FIG. 3, a source signal may be easily loaded through a data line 12. Therefore, the difficulty of test of the thin-film transistor is to load the gate signal and measure the drain signal. The gate line 11 of the array substrate may be connected to an external test pad 13, to load the gate signal through the test pad 13; furthermore, the drain signal may be measured through the conductive contact 10, so that signals of the thin-film transistor may be loaded and tested.

Figure 5:
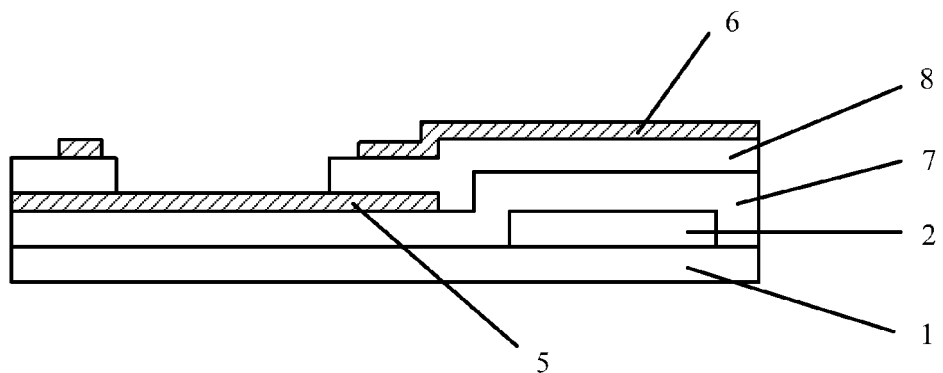
FIG. 5 shows an array substrate according to another embodiment of the present invention.

FIG. 5 shows an array substrate according to another embodiment of the present invention. As the pixel electrode 5 is conductive itself, conductive contact may not be formed on the exposed pixel electrode 5. Instead, the drain signal may be measured directly through the exposed pixel electrode 5. In this way, the test on the thin-film transistor may also be realized.

The embodiment of the present invention further provides a display panel comprising any one array substrate described above. Certainly, the display panel further comprises other known structures, for example, a color film, a black matrix and the like, which will not be described in details here.

In the display panel comprising the array substrate according to the embodiment of the present invention, in each pixel unit, an opening is formed within the pixel region to expose the pixel electrode 5, thus the electric field within the opening area is changed. Therefore, it is required to shield the opening areas by a black matrix, so as to avoid abnormal display. In this way, the conductive contact 10 is located within the non-display region of the array substrate. In addition, in the display panel, as blue pixels have the lowest transmittance, the openings are preferably provided in the blue pixels in order to reduce the influence on the transmittance.

In order not to affect the overall transmittance of the display panel, the openings may be uniformly distributed on the display panel. In order to make the characteristics of the thin-film transistor to be tested regionally representative, preferably, no less than nine openings are distributed evenly. On the premise that the transmittance is not significantly influenced, openings may be provided as much as possible.

Figure 4:
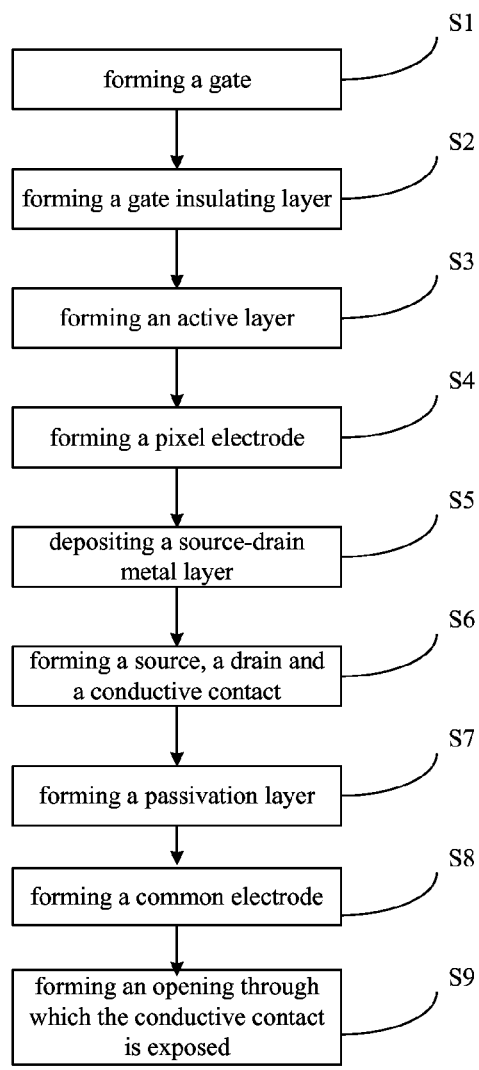
FIG. 4 is a flowchart diagram of a method for manufacturing an array substrate according to the embodiment of the present invention.

FIG. 4 is a flowchart diagram of a method for manufacturing the array substrate according to the embodiment of the present invention. Still referring to FIG. 1B, FIG. 2A and FIG. 2B, as shown in FIG. 4, the manufacturing method comprises steps S1-S9: S1: forming a gate 2 on a substrate 1; S2: forming a gate insulating layer 7 to cover the substrate 1 and the gate 2; S3: forming an active layer 4 corresponding to the gate 2 on the gate insulating layer 7; S4: forming a pixel electrode 5 on the gate insulating layer 7; S5: depositing a source-drain metal layer; S6: patterning the source-drain metal layer to form a source, a drain and a conductive contact 10, wherein the source and the drain are located on the active layer 4, the drain is located on and in electric contact with the pixel electrode 5, and, the conductive contact 10 is located on and in electric contact with the pixel electrode 5 and is located within an opening to be formed; S7: depositing a passivation layer 8 to cover the source, the drain, the pixel electrode 5 and the conductive contact 10; S8: forming a common electrode 6 on the passivation layer 8; and S9: forming the opening 9 passing through the passivation layer 8 in the common electrode 6, so as to expose the conductive contact 10.

With the solutions disclosed by the present invention, by using the existing manufacturing process with mask, an array substrate in which the characteristics of the thin-film transistor can be measured easily is manufactured, so that the accuracy of analysis for poor display events of the display panel is improved.

Although the embodiments of the present invention have been described with reference to the accompanying drawings, a person skilled in the art may make various modifications and variations without departing from the spirit and scope of the present invention. These modifications and variations shall be within the scope defined by the appended claims.

The invention claimed is:

1. An array substrate, comprising a plurality of pixel units, each of which comprises:
    a gate formed on a substrate;
    a gate insulating layer formed on the gate;
    an active layer being corresponding to the gate and formed on the gate insulating layer;
    a source and a drain formed on the active layer, respectively;
    a pixel electrode formed on the gate insulating layer and electrically connected to the drain;
    a passivation layer covering the source, the drain and the pixel electrode;
    a common electrode being corresponding to the pixel electrode and formed on the passivation layer, wherein an opening passing through the passivation layer is formed in the common electrode, so as to expose the pixel electrode below the passivation layer; and a conductive contact formed on a part of the pixel electrode exposed by the opening, wherein the conductive contact is formed only in the opening and is formed on a surface of the pixel electrode away from the gate insulating layer.

2. The array substrate according to claim 1, wherein the drain is formed on the pixel electrode.

3. A display panel, comprising an array substrate, wherein the array substrate comprises a plurality of pixel units, each of which comprises:
- a gate formed on a substrate;
- a gate insulating layer formed on the gate;
- an active layer being corresponding to the gate and formed on the gate insulating layer;
- a source and a drain formed on the active layer, respectively;
- a pixel electrode formed on the gate insulating layer and electrically connected to the drain;
- a passivation layer covering the source, the drain and the pixel electrode;
- a common electrode being corresponding to the pixel electrode and formed on the passivation layer, wherein an opening passing through the passivation layer is formed in the common electrode, so as to expose the pixel electrode below the passivation layer;
- a black matrix inside the display panel shields the openings; and
- a conductive contact formed on a part of the pixel electrode exposed by the opening, wherein the conductive contact is formed only in the opening and is formed on a surface of the pixel electrode away from the gate insulating layer.

4. The display panel according to claim 3, wherein the openings are formed in blue pixels of the display panel.

5. The display panel according to claim 3, wherein the display panel comprises at least nine openings which are distributed uniformly.

6. The display panel according to claim 4 wherein the display panel comprises at least nine openings which are distributed uniformly.

7. A method for manufacturing an array substrate, comprising:
- forming a gate on a substrate;
- forming a gate insulating layer on the gate;
- forming an active layer corresponding to the gate on the gate insulating layer;
- forming a pixel electrode on the gate insulating layer;
- forming a source and a drain on the active layer;
- depositing a passivation layer to cover the source, the drain and the pixel electrode;
- forming a common electrode corresponding to the pixel electrode on the passivation layer;
- forming an opening passing through the passivation layer in the common electrode, so as to expose the pixel electrode below the passivation layer; and
- forming a conductive contact on a part of the pixel electrode exposed by the opening, wherein the conductive contact is formed only in the opening and is formed on a surface of the pixel electrode away from the gate insulating layer.

8. The method according to claim 7, wherein the conductive contact is formed in the same step as the source and the drain.

9. The method according to any one of claim 7, wherein the drain is formed on the pixel electrode.

10. The method according to any one of claim 8, wherein the drain is formed on the pixel electrode.

* * * * *